United States Patent [19]
Kommrusch et al.

[11] Patent Number: 5,584,053
[45] Date of Patent: Dec. 10, 1996

[54] COMMONLY COUPLED HIGH FREQUENCY TRANSMITTING/RECEIVING SWITCHING MODULE

[75] Inventors: Richard S. Kommrusch; Rong-Fong Huang; John C. Estes, all of Albuquerque, N.M.

[73] Assignee: Motorola, Inc., Schaumburg, Ill.

[21] Appl. No.: 511,573

[22] Filed: Aug. 4, 1995

[51] Int. Cl.[6] ........................................ H04B 1/44
[52] U.S. Cl. ........................... 455/82; 455/83; 333/104
[58] Field of Search ........................... 455/78, 80, 81, 455/82, 83, 88, 89, 272, 275, 277.1, 277.2; 333/101, 103, 104

[56] References Cited

U.S. PATENT DOCUMENTS 4,803,447   2/1989   Schultz et al. ................. 455/277.1
4,914,714   4/1990   Tamura ........................... 455/277.1

FOREIGN PATENT DOCUMENTS 406037668   2/1994   Japan ................................. 455/82

*Primary Examiner*—Andrew Faile
*Assistant Examiner*—Thanh Le
*Attorney, Agent, or Firm*—Gary J. Cunningham; Brian M. Mancini

[57] ABSTRACT

What is described is a commonly coupled high frequency transmitting/receiving switching module (100). The switching module (100), has a transmitting circuit (102), a receiving circuit (104), an antenna circuit (106), an external circuit (108), a coupling circuit (110) and control circuits (124, 126). The switching module may be switched between one of four circuit paths (202, 204, 206, 208) each path incorporating an integral harmonic filter (210, 212). This structure is adapted for use in a multi-layer ceramic integrated circuit, and provides the advantage of minimizing current consumption with a minimal number of components.

21 Claims, 3 Drawing Sheets

COMMONLY COUPLED HIGH FREQUENCY TRANSMITTING/RECEIVING SWITCHING MODULE

FIELD OF THE INVENTION

The invention relates generally to the field of radio frequency switching circuits for use in communication devices, and particularly to a commonly coupled high frequency transmitting/receiving switching module used in a transceiver.

BACKGROUND OF THE INVENTION

Transmitting/receiving switching modules have normally been used in communication systems wherein the transmit and receive frequencies are shared. For example, in a Time Division Multiple Access (TDMA) cellular communication system, a single frequency channel can be utilized to alternately transmit and receive signals.

In particular, the radiotelephone to which a base station transmits a TDMA signal may, in turn, transmit a TDMA signal to the base station, thereby permitting two-way communication between the base station and the radiotelephone upon a single frequency channel during alternate time periods. In such a system, switching circuitry may be utilized alternately to connect the receiver or transmitter circuitry to the radiotelephone antenna.

In FIG. 1 a prior art radio transceiver 10 with switching circuitry is shown. A transmitter 12 is coupled to an antenna 14 via a blocking capacitor 22 and a diode 20, wherein a cathode 24 of the diode 20 is connected to the antenna 14. A receiver 16 is also connected to the antenna 14 via a blocking capacitor 26 and a one-quarter wavelength transmission line 25. Additionally, the antenna 14 may include a series blocking capacitor (not shown).

In the transceiver 10, an anode 30 of a biasing diode 28 is connected to a junction of the transmission line 24 and the blocking capacitor 26. A cathode 32 of the biasing diode 28 is connected to ground. A transmission line choke 34 is connected between a control signal input 38 and a junction of the blocking capacitor 22 and the diode 20 of the transmitter circuitry. A shunt capacitor 36 is connected at the control signal input 38 to provide a RF ground.

In a transmit mode, a positive bias voltage is applied to the control signal input 38 such that a DC bias current flows to ground through the transmission line choke 34, diode 20, transmission line 25 and biasing diode 28. This DC bias current switches the diodes 20 and 28 into a conducting state, such that a signal from the transmitter 12 is coupled through the diode 20 to the antenna, while the biasing diode 28 electrically shorts the input of the receiver 16 and one end of the transmission line 25 to ground. It is well known that if a one-quarter wavelength transmission line is electrically shorted at one end, the opposite end appears to be an electrically open circuit. Therefore, because the biasing diode 28 electrically shorts one end of the transmission line 25 in the transmit mode, the opposite end (coupled to the antenna 14) appears as an electrically open circuit and substantially no signal from the transmitter 12 flows through the transmission line 25 to the receiver 16.

The transmission line choke 34 acts as a one-quarter wavelength RF choke to prevent transmitter 12 losses through the control signal input 38. Additionally, the shunt capacitor 36 electrically shorts extraneous RF signals to ground.

In a receive mode, the bias voltage is substantially at ground, and subsequently, there is substantially no DC bias current through the transmission line choke 34, diode 20, transmission line 25 and biasing diode 28. With substantially no bias current, the diode 20 and biasing diode 28 are in a non-conducting, high impedance state. Because the biasing diode 28 is in a high impedance state, very little received signal energy is lost to ground through the biasing diode 28, and the transmission line 25 is terminated in its characteristic impedance by the input circuitry of the receiver 16. Thus, the received signal at the antenna 14 is coupled to the input of the receiver 16 through the transmission line 25 and blocking capacitor 26. In addition, in the receive mode, substantially no received signal energy is lost in the transmitting or control circuitry 18 because the high impedance state of the diode 20 decouples the transmitter 12 from the antenna 14.

In recent years, such switching circuitry has been miniaturized using integrated multi-layer ceramic technology. However, the small size and proximity of components on a single module results in unexpected stray capacitances and resultant signal loss. This signal loss degrades circuit and radiotelephone performance. Further, the addition of test ports and connections necessary to test the radiotelephone contributes additional stray capacitance and resultant signal loss. In some radiotelephones it is desirable to have an external port for connecting an alternate antenna, such as a mobile antenna on a vehicle. As this type of functionality is added to these switching modules, and attempts are made to reduce stray capacitance, the size of the module has increased, defeating the original requirement of miniaturization. It would be considered an improvement in the art to incorporate the functionality of an external port in the switching circuitry. Also, it would be considered an improvement in the art to utilize the stray capacitances of the multi-layer ceramic constructively to provide beneficial harmonic filtering while keeping the physical size of the ceramic device the same.

In FIG. 2, a five-element, low pass harmonic filter 50 is shown. It should be recognized that capacitors 54 and inductors provide harmonic filtering action and that the number of elements may be increased or decreased in a cascade fashion to adjust the amount of filtering. For example, more elements would increase the filtering action. In this harmonic filter 50, transmission lines 52 provide inductance and should be of about one-quarter wavelength. The function of the harmonic filter 50 may be established in the multi-layer ceramic switching module by utilizing any existing transmission lines in a signal path. These existing transmission lines would provide the necessary inductance (shown as 52) for the harmonic filter 50, and any existing stray capacitances caused by the multi-layer ceramic technology provides the necessary capacitance (shown as 54) for the harmonic filter 50. Therefore, all the elements for a harmonic filter 50 already exist in a multi-layer ceramic switching module.

It would be considered an improvement in the art, to incorporate existing stray capacitances in a multi-layer ceramic structure to provide beneficial harmonic filtering to damp unwanted radiated frequencies.

It would also be considered an improvement in the art, to have a switching module having a commonly shared portion between the transmitter, receiver, antenna and external antenna ports of the module, whereby the commonly shared portion would accommodate all the required switching module functionality while reducing parts count.

Additionally, it would be considered an improvement in the art where such commonly shared portion could be commonly utilized by each circuit to minimize the detrimental effects of stray capacitance between each circuit.

The need exists for a new switching module that can; incorporate an external port circuit along with the required switching circuitry, minimize the number of components to improve spatial efficiency and reduce component interaction, minimize the detrimental effects from stray capacitances, and provide harmonic filtering to suppress unwanted radiated frequencies.

DETAILED DESCRIPTION OF THE PREFERRED EMBODIMENT

Figure 1:
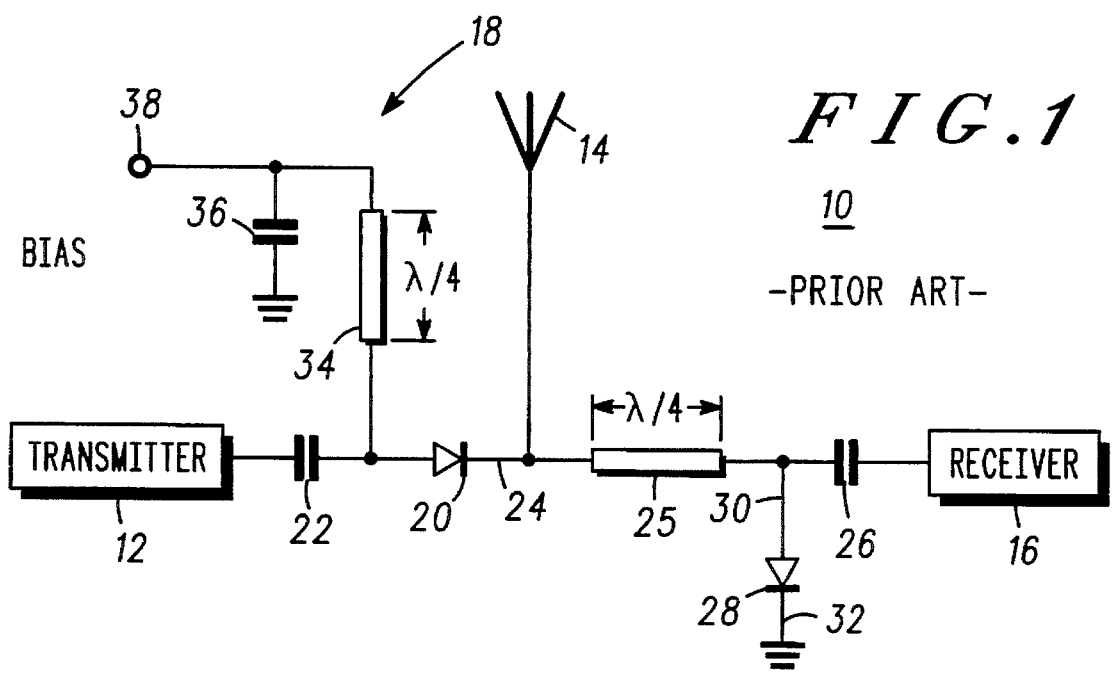
FIG. 1 shows an electrical circuit schematic diagram of a prior art transmit/receive switch.
Figure 2:
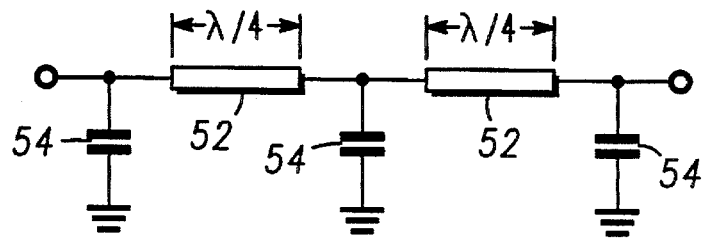
FIG. 2 shows an electrical circuit schematic diagram of a prior art harmonic filter circuit.
Figure 3:
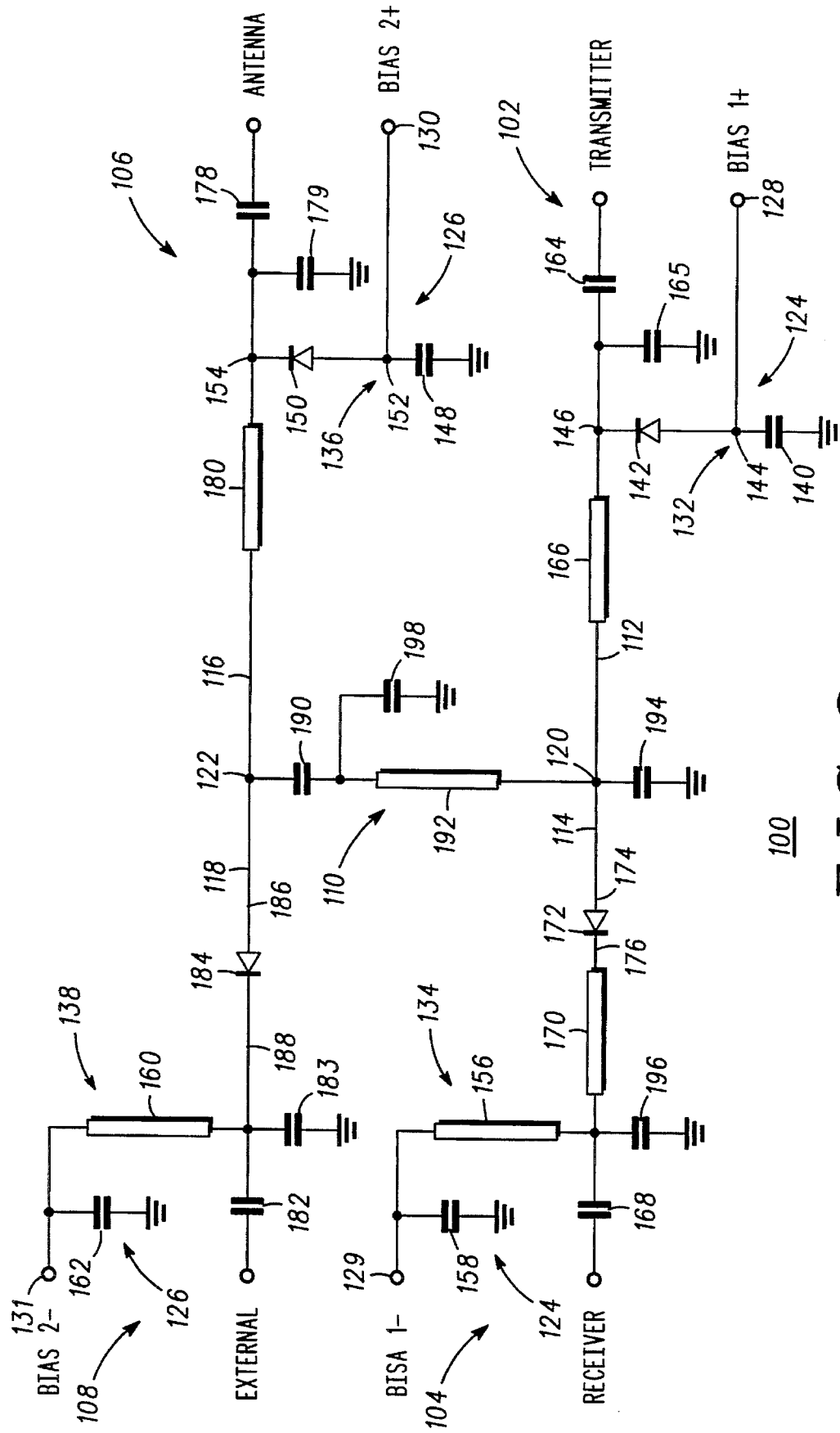
FIG. 3 is a preferred embodiment of an electrical circuit schematic diagram of a commonly coupled high frequency transmitting/receiving switching module, in accordance with the present invention.

In FIG. 3, a commonly coupled high frequency transmitting/receiving switching module 100 is shown. In its simplest form, the switching module 100 includes: a transmitting circuit 102, a receiving circuit 104, an antenna circuit 106, an external circuit 108, at least one control circuit 124, 126 and a common coupling circuit 110. The external circuit 108 advantageously provides a connection wherein a signal from an external, alternate antenna can be input or output to test various circuit configurations of the switching module. In one embodiment of the switching module 100, an output 112 of the transmitting circuit 102 and an output 114 of the receiving circuit 104 are connected at a first junction 120, and an output 116 of the antenna circuit 106 and an output 118 of the external circuit 108 are connected at a second junction 122. Further, the first and second junctions 120, 122 are coupled via a common coupling circuit 110.

In particular, the switching module 100 may be configured so that the desired signal is always coupled to the switched circuits through the common coupling circuit 110. The common coupling circuit 110 has the advantage of substantially isolating the unswitched circuits from the switched circuits. More particularly, the specific switched circuit path for the desired signal is controlled by a first and second control circuit 124, 126 and an associated first and second control signal 128, 130. The first and second control circuits 124, 126 each comprise a first and second leg 132, and 134, and 136, and 138, respectively.

The first leg 132, 136 of each control circuit 124, 126 includes a nulling capacitor 140, 148 and a biasing diode 142, 150. The nulling capacitor 140, 148 is connected between an anode 144, 152 of the biasing diode 142, 150 and ground. The nulling capacitor 140, 148 has the advantage of substantially negating the inductance presented by the biasing diode 142, 150, and therefore, substantially reducing interactions with the desired signal. In a preferred embodiment, a positive bias of the control signal 128, 130 is applied to the junction (shown as 144, 152) of the nulling capacitor 140, 148 and the biasing diode 142, 150. Alternatively, it should be recognized that a negative bias or grounding of the control signal 128, 130 may be applied to the junction (shown as 144, 152) as long as the connections of the diodes 142, 150, 172, 184 are reversed.

The second leg 134, 138 of each control circuit 124, 126 includes a transmission line choke 156, 160 and a shunt capacitor 158, 162. The transmission line choke 156, 160 is of about one-quarter wavelength and is connected to a shunt capacitor 158, 162 which is in turn connected to ground. In a preferred embodiment, the characteristic impedance of the transmission line choke 156, 160 is about twice that of any other transmission line 166, 170, 180, 192 in the switching module 100. More particularly, the transmission line choke 156, 160 has a characteristic impedance of about 115 ohms. The advantage of this is that the higher impedance translates to a smaller physical size which is desirable, improves the performance of a harmonic filter, and provides an improved equivalent electrically open circuit to substantially reduce signal losses through the control circuit 124, 126. In a preferred embodiment, a negative bias of the control signal 129, 131 is applied to the junction of the transmission line choke 156, 160 and shunt capacitor 158, 162. In one embodiment, the negative bias of the control signal 129, 131 is chosen to be ground. In this instance, the shunt capacitor 158, 162 would not be required. The advantage of using negative bias is to provide optional flexibility in the application of control signals. Alternatively, it should be recognized that a positive bias of the control signal 129, 131 may be applied to the junction of the transmission line choke 156, 160 and shunt capacitor 158, 162 as long as the connections of the diodes 142, 150, 172, 184 are reversed.

As shown in FIG. 3, the transmitting circuit 102 comprises a DC blocking capacitor 164, a transmission line 166 and the first leg 132 of the first control circuit 124. The DC blocking capacitor 164 is connected to the transmission line 166 and a cathode 146 of the biasing diode 142 of the first leg 132 of the first control circuit 124. The opposite end of the transmission line 166 defines the output 112 of the transmitting circuit 102. It is desired that the transmission line 166 be of about one-quarter wavelength. It should be recognized that the DC blocking capacitor 164 has an associated stray capacitance 165, and that this stray capacitance 165 effectively lengthens the transmission line 166. In a preferred embodiment, it is advantageous to shorten the transmission line 166 to a predetermined length to account for the stray capacitance 165, and to provide a substantially equivalent one-quarter wavelength transmission line 166. Preferably, the characteristic impedance of the transmission line 166 is selected to be from about 50 to 75 ohms. This has the advantage of substantially optimizing both coupling and decoupling of the transmitting circuit 102 as it is operably switched in and out, respectively.

The receiving circuit 104 comprises a DC blocking capacitor 168, a transmission line 170, a diode 172 having an anode 174 and a cathode 176 and the second leg 134 of the first control circuit 124. The DC blocking capacitor 168 is connected to both the transmission line 170 and the transmission line choke 156 of the second leg 134 of the first control circuit 124. The transmission line 170 is subsequently connected to the cathode 176 of the diode 172. The anode 174 of the diode 172 defines the output 114 of the receiving circuit 104. It is desired that the transmission line 170 be of about one-quarter wavelength. It should be recognized that the DC blocking capacitor 168 has an associated stray capacitance 196, and that this stray capacitance 196 effectively lengthens the transmission line 170. In a preferred embodiment, it is advantageous to shorten the transmission line 170 to a predetermined length to account for the stray capacitance 196 and to provide a substantially equivalent one-quarter wavelength transmission line 170. Preferably, the characteristic impedance of the transmission line 170 is selected to be from about 50 to 75 ohms. This has the advantage of substantially optimizing both coupling and decoupling of the receiving circuit 104 as it is operably switched in and out, respectively. The transmission line 170 of the receiving circuit 104 may be particularly short because of the inductance contribution from the diode 172. This has the advantage of shrinking physical circuit size.

The antenna circuit 106 comprises a DC blocking capacitor 178, a transmission line 180 and the first leg 136 of the second control circuit 126. The DC blocking capacitor 178 is connected to the transmission line 180 and a cathode 154 of the biasing diode 150 of the first leg 136 of the second control circuit 126. The opposite end of the transmission line defines the output 116 of the antenna circuit 106. It is desired that the transmission line 180 be of about one-quarter wavelength. It should be recognized that the DC blocking capacitor 178 has an associated stray capacitance 179, and that this stray capacitance 179 effectively lengthens the transmission line 180. In a preferred embodiment, it is advantageous to shorten the transmission line 180 to a predetermined length to account for the stray capacitance 179 and to provide a substantially equivalent one-quarter wavelength transmission line 180. Preferably, the characteristic impedance of the transmission line 180 is selected to be from about 50 to 75 ohms. This has the advantage of substantially optimizing both coupling and decoupling of the antenna circuit 106 as it is operably switched in and out, respectively.

The external circuit 108 comprises a DC blocking capacitor 182, a diode 184 having an anode 186 and a cathode 188 and the second leg 138 of the second control circuit 126. The DC blocking capacitor 182 is connected to both the cathode 188 of the diode 184 and the transmission line choke 160 of the second leg 138 of the second control circuit 126. The anode 186 of the diode 184 defines the output 118 of the external circuit 108. The external circuit 108 has the advantage of providing an alternate antenna port to the radiotelephone. This has the advantage of allowing testing of the radiotelephone with controlled signals, and without having to be concerned about extraneous signals entering the antenna circuit 106 and interfering with testing. Since the external testing is not part of the main functionality of the radiotelephone, it is not necessary to incorporate a transmission line in the circuit 108. The diode 184 provides sufficient isolation for this circuit 108. However, it should be recognized that a transmission line could be incorporated to provide improved harmonic isolation in conjunction with the stray capacitance 183 of DC blocking capacitor 182 analogous to the receiver circuit, but that, this has the disadvantage of increasing the size for the switching module 100.

The common coupling circuit 110 comprises a transmission line 192 and a DC blocking capacitor 190. It is desired that the transmission line 192 be of about one-quarter wavelength. It should be recognized that the DC blocking capacitor 190 has an associated stray capacitance 198, and that this stray capacitance 198 effectively lengthens the transmission line 192. In a preferred embodiment, it is advantageous to shorten the transmission line 192 to a predetermined length to account for the stray capacitance 198 and to provide a substantially equivalent one-quarter wavelength transmission line 192. Preferably, the characteristic impedance of the transmission line 192 is selected to be from about 50 to 75 ohms. The common coupling circuit 110 provides the advantages of: allowing the incorporation of an external, alternate antenna port 108 along with the required switching circuitry 102, 104, 106; minimizing the number of components to improve spatial efficiency due to the common sharing of circuitry 110 among the transmitting 102, receiving 104, external 108 and antenna circuitry 106 of the module 100; minimizing circuit mismatches and incorporating stray capacitance as an element of a harmonic filter.

It should be recognized that in another embodiment of the switching module 100, the transmitting and receiving functions may be interchanged as well as the antenna and external functions. However, in a preferred embodiment the transmitting 102 and antenna 106 circuitry do not have a diode in series with the signal path. This has the advantage of reducing current drain on the radiotelephone since diodes cause voltage drops and signal losses. Because the transmit function of the radio telephone uses the most power and current, less current is wasted when transmitting through a signal path without series diodes.

It should also be recognized that the stray capacitances 165, 179, 183, 196, 198 are distributive in nature, and are shown as discrete elements only for simplicity.

Figure 4:
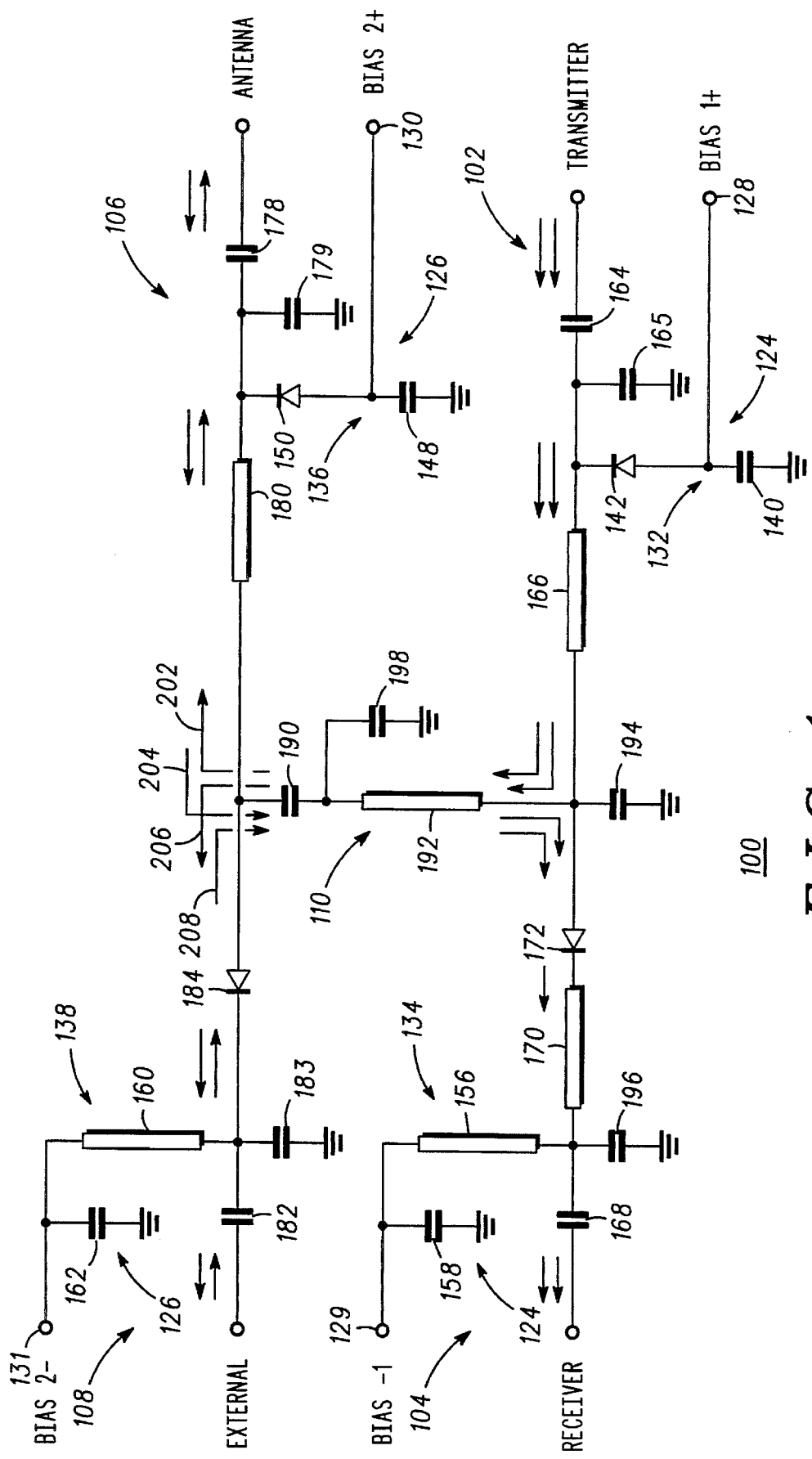
FIG. 4 shows an electrical schematic of four operable circuit configurations of the commonly coupled high frequency transmitting/receiving switching module, in accordance with the present invention.

In operation, first and second control signals 128, 129, 130, 131 are applied to their respective positive and negative bias control signal inputs, as shown in FIG. 4, to provide operability of the switching module 100.

A first circuit path 202 is provided when no control signals are present on the first or second control circuits 124, 126, wherein the transmitting circuit 102 is coupled to the antenna circuit 106 via the common coupling circuit 110, and the receiving 104 and external circuits 108 are substantially decoupled from the common coupling circuit 110.

In this embodiment, the first and second control signals 128, 129, 130, 131 are substantially at ground, and subsequently, there is substantially no DC bias current through any of the diodes 142, 150, 172, 184. With substantially no bias current, the diodes 172, 184 and biasing diodes 142, 150 are in a substantially non-conducting, high impedance state. Because the biasing diodes 142, 150 are in a high impedance state, advantageously substantially no transmitted signal energy is lost to ground through the first leg 132, 136 of each control circuit 124, 126, and the transmission lines 166, 192, 180 of the transmitting 102, coupling 110 and antenna circuits 106 are terminated in their characteristic impedance by the input of the transmitter. Thus, a signal transmitted from the transmitter is coupled to the antenna through the transmission lines 166, 192, 180, and DC blocking capacitors 164, 190, 178 of the transmitting 102, coupling 110 and antenna circuitry 106. In a preferred embodiment, the characteristic impedance of the transmitting, coupling and antenna transmission lines 180, 192, 166 are about 50 to 75 ohms. In addition, in the first circuit path 202, advantageously substantially no transmitted signal energy is lost in the receiving 104 or external circuitry 108 because the high impedance state of the receiving circuit diode 172 which substantially decouples the receiving circuit 104 from the common coupling circuit 110 and the high impedance state of the external circuit diode 184 which decouples the external circuit 108 from the common coupling circuit 110. The first circuit path 202 has the further advantage of having no diodes in series with the signal path 202 which might increase current drain during transmitting.

The first circuit path 202 also provides the advantage of forming a seven-element harmonic filter by virtue of the transmission line/stray capacitance combinations in the transmitting 166, 165, coupling 192, 198 and antenna 180, 179 circuits 102, 110, 106, in conjunction with the shunt capacitor 194. The harmonic filter serves to substantially reduce transmitted high harmonic frequencies which may interfere with the operability of nearby radiotelephones.

A second circuit path 204 is provided when a control signal 128, 129 is present on the first control circuit 124 and none is present on the second control circuit 126, wherein the receiving circuit 104 is subsequently coupled to the antenna circuit 106 via the common coupling circuit 110, and the transmitting 102 and external circuits 108 are substantially decoupled from the common coupling circuit 110.

In this embodiment, a positive bias voltage is applied to the control signal input 128 of the first leg 132 of the first control circuit 124 such that a DC bias current flows to ground through the biasing diode 142 and transmission line 166 of the transmitting circuit 102 and the diode 172, transmission line 170 and transmission line choke 156 of the receiving circuit 104. This DC bias current switches the diode 172 of the receiving circuit 104 and the biasing diode 142 of the transmitting circuit 102 into a conducting state. The biasing diode 142 of the transmitter circuit 102 effectively electrically shorts the input of the transmitter and one end of the transmission line 166. It is well known that if a one-quarter wavelength transmission line is electrically shorted at one end, the opposite end appears to be an electrically open circuit. Therefore, because the biasing diode 142 of the transmitting circuit 102 electrically shorts one end of the transmission line 166, advantageously the opposite end (connected to the coupling circuit 110) appears as a substantially electrical open circuit and is therefore substantially decoupled from the coupling circuit 110. Further, because the second control signal 130 is substantially at ground, there is substantially no DC bias current through the external circuit diode 184 or antenna circuit 106 biasing diode 150. With substantially no bias current, the external circuit diode 184 and antenna circuit 106 biasing diode 150 are in a substantially non-conducting, high impedance state. Because the antenna circuit 106 biasing diode 150 is in a high impedance state, advantageously substantially no received signal energy is lost to ground through the first leg 136 of the second control circuit 126, and the transmission lines 180, 192, 170 of the antenna 106, coupling 110, and receiving circuits 104 are terminated in their characteristic impedance by the input of the receiver. Thus, the received signal at the antenna is coupled to the input of the receiver through the transmission lines 180, 192, 170 and DC blocking capacitors 178, 190, 168 of the antenna 106, coupling 110 and receiving circuitry 104 and the receiving circuit diode 172. In a preferred embodiment, the characteristic impedance of the receiving, coupling and antenna transmission lines 170, 192, 180 are about 50 to 75 ohms. In addition, in the second circuit path 204, advantageously substantially no transmitted signal energy is lost in the external circuitry 108 because the high impedance state of the external circuit diode 184 which substantially decouples the external circuit 108 from the common coupling circuit 110.

The second circuit path 204 also provides the advantage of forming a seven-element harmonic filter by virtue of the transmission line/stray capacitance combinations in the antenna 180, 179, coupling 192, 198 and receiving 170, 196 circuits 104, 110, 106, in conjunction with the shunt capacitor 194. The harmonic filter serves to substantially reduce received high harmonic frequencies which may interfere with the operability of the radiotelephone.

A third circuit path 206 is provided when a control signal 130 is present on the second control circuit 126 and none is present on the first control circuit 124, wherein the transmitting circuit 102 is coupled to the external circuit 108 via the common coupling circuit 110, and the receiving 104 and antenna circuits 106 are substantially decoupled from the common coupling circuit 110.

In this embodiment, a positive bias voltage is applied to the control signal input 130 of the first leg 136 of the second control circuit 126 such that a DC bias current flows to ground through the biasing diode 150 and transmission line 180 of the antenna circuit 106, and the diode 184 and transmission line choke 160 of the external circuit 108. This DC bias current switches the diode 184 of the external circuit 108 and the biasing diode 150 of the antenna circuit 106 into a conducting state. The biasing diode 150 of the antenna circuit 106 effectively electrically shorts the input of the antenna and one end of the transmission line 180. It is well known that if a one-quarter wavelength transmission line is electrically shorted at one end, the opposite end appears to be an electrically open circuit. Therefore, because the biasing diode 150 of the antenna circuit 106 electrically shorts one end of the transmission line 180, advantageously the opposite end (connected to the coupling circuit 110) appears as a substantially electrically open circuit and is therefore substantially decoupled from the coupling circuit 110. Further, because the first control signal 128 is substantially at ground, there is substantially no DC bias current through the receiving circuit diode 172 or transmitting circuit biasing diode 142. With substantially no bias current, the receiving circuit diode 172 and transmitting circuit biasing diode 142 are in a substantially non-conducting, high impedance state. Because the transmitting circuit biasing diode 142 is in a high impedance state, advantageously substantially no transmitted signal energy is lost to ground through the first leg 132 of the first control circuit 124, and the transmission lines 166, 192 of the transmitting 102 and coupling 110 circuits are terminated in their characteristic impedance by the input of the transmitter. Thus, a signal transmitted from the transmitter is coupled to the external port through the transmission lines 166, 192, DC blocking capacitors 164, 190, 182, and the external circuit diode 184 of the transmitting 102, coupling 110 and external 108 circuitry. In a preferred embodiment, the characteristic impedance of the transmitting and coupling transmission lines 166, 192 are about 50 to 75 ohms. In addition, in the third circuit path 206, advantageously substantially no transmitted signal energy is lost in the receiving circuitry 104 because the high impedance state of the receiving circuit diode 172 which substantially decouples the receiving circuit 104 from the common coupling circuit 110.

The third circuit path 206 also provides the advantage of forming a five-element harmonic filter by virtue of the transmission line/stray capacitance combinations in the transmitting 166, 165 and coupling 192, 198 circuits 102, 110, in conjunction with the shunt capacitor 194. The harmonic filter serves to substantially reduce transmitted high harmonic frequencies which may interfere with the operability of nearby radiotelephones.

A fourth circuit path 208 is provided when a control signal 128, 130 is present on both the first and second control circuits 124, 126, wherein the receiving circuit 104 is coupled to the external circuit 108 via the common coupling circuit 110, and the transmitting 102 and antenna circuits 106 are substantially decoupled from the common coupling circuit 110.

In this embodiment, a positive bias voltage is applied to the control signal input 128, 130 of the first leg 132, 136 of both control circuits 124, 126 such that a DC bias current flows to ground through the biasing diodes 142, 150 of the first leg 132, 136 of both control circuits 124, 126, the transmission lines 180, 166 of the antenna 106 and transmitting circuit 102, the diodes 172, 184 of the receiving 104 and external circuits 108, and the transmission line chokes 156, 160 of the second leg 134, 138 of both control circuits 124, 126. These DC bias currents switch all the diodes 142, 150, 172, 184 of the switching module 100 into a conducting state. The biasing diodes 142, 150 of the first legs 132, 136 of both control circuits 124, 126 effectively electrically shorts one end of the antenna and transmitting transmission lines 180, 166. It is well known that if a one-quarter wavelength transmission line is electrically shorted at one end, the opposite end appears to be an electrically open circuit. Therefore, because the biasing diodes 142, 150 electrically short one end of these transmission lines 166, 180, advantageously the opposite ends (connected to the coupling circuit 110) appear as substantially electrically open circuits and are therefore substantially decoupled from the coupling circuit 110. Further, the transmission lines 170, 192 of the receiving and coupling circuits are terminated in their characteristic impedance by the input of the receiver. Thus, the received signal at a receiver port is coupled to the external port through the transmission lines 170, 192, DC blocking capacitors 168, 190, 182 and diodes 172, 184 of the receiving 104, coupling 110 and external circuitry 108. In a preferred embodiment, the characteristic impedance of the receiving and coupling transmission lines 170, 192 are about 50 to 75 ohms.

The fourth circuit path 208 also provides the advantage of forming a five-element harmonic filter by virtue of the transmission line/stray capacitance combinations in the receiving 170, 196 and coupling 192, 198 circuits 104, 110, in conjunction with the shunt capacitor 194. The harmonic filter serves to substantially reduce received high harmonic frequencies from test equipment which may interfere with the operability of the radiotelephone.

In a preferred embodiment, for all circuit paths 202, 204, 206, 208 the transmission line chokes 156, 160 act as substantially equivalent one-quarter wavelength RF chokes to prevent signal losses through the second leg 134, 138 of each control circuit 124, 126. Additionally, the shunt capacitors 158, 162 electrically short extraneous RF signals to ground. More particularly, the characteristic impedance of the transmission line chokes 156, 160 is about 115 ohms. This has the advantage of improving the isolation of the control circuits 124, 126.

In a preferred embodiment, the switching module 100 is disposed on a plurality of ceramic layers defining a single ceramic block device. This has the advantage of self-shielding, miniaturization, ease of manufacturability, reduced parts count, low cost, minimizing interference that would exist with discrete components and low insertion loss.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A high frequency transmitting/receiving switching module, comprising:

a transmitting circuit having an output;

a receiving circuit having an output;

an antenna circuit having an output;

an external circuit having an output;

the outputs of the transmitting and receiving circuits being connected defining a first junction and including a first control circuit, the outputs of the external and antenna circuits being connected defining a second junction and including a second control circuit; and the first junction being coupled to the second junction via a common coupling circuit, whereby a control signal selectively applied to at least one of the first and the second control circuits selectively couples the transmitting or receiving circuit to the antenna or external circuit via the common coupling circuit, the common coupling circuit substantially isolating switched circuits from unswitched circuits.

2. The switching module of claim 1, wherein the first and second control circuits each comprise a first and a second leg, the first leg including a nulling capacitor and a biasing diode having a cathode and an anode, the anode being connected to a nulling capacitor, the second leg including a transmission line choke of about one-quarter wavelength being connected to a shunt capacitor.

3. The switching module of claim 2, wherein the transmitting circuit comprises a DC blocking capacitor being connected to a transmission line of about one-quarter wavelength and the first leg of the first control circuit, whereby a signal in the transmitting circuit does not pass through any diode.

4. The switching module of claim 2, wherein the receiving circuit comprises a DC blocking capacitor, a transmission line of about one-quarter wavelength and a diode having an anode and a cathode, the DC blocking capacitor being connected to the second leg of the first control circuit and the transmission line, the transmission line being connected to the cathode of the diode.

5. The switching module of claim 2, wherein the antenna circuit comprises a DC blocking capacitor being connected to a transmission line of about one-quarter wavelength and the first leg of the second circuit, whereby a signal in the antenna circuit does not pass through any diode.

6. The switching module of claim 2, wherein the external circuit comprises a DC blocking capacitor and a diode having an anode and a cathode, the DC blocking capacitor being connected to the second leg of the second control circuit and the cathode of the diode.

7. The switching module of claim 1, wherein the common coupling circuit comprises a transmission line of about one-quarter wavelength being connected to a DC blocking capacitor.

8. The switching module of claim 1, wherein the transmitting, receiving, antenna, and common coupling circuits each include a transmission line of predetermined length coupled to a stray capacitance, the predetermined length of each transmission line being selected to compensate and incorporate said each associated stray capacitance to provide a substantially equivalent one-quarter wavelength transmission line, whereby a harmonic filter is provided substantially independently for each switched circuit mode.

9. The switching module of claim 8, wherein the circuits and transmission lines are disposed upon at least one ceramic substrate.

10. A high frequency transmitting/receiving switching module including transmitting, receiving, common coupling, antenna, external, first and second control circuits, and at least one control signal, the control circuits selectively permitting interconnection of the transmitting or receiving circuit to the antenna or external circuit via the common coupling circuit, the switching module comprising:

a first circuit path interconnecting the transmitting circuit and the antenna circuit via the common coupling circuit when no control signals are present, the receiving and external circuits being substantially electrically isolated from the transmitting and antenna circuits;

a second circuit path interconnecting the receiving circuit and the antenna circuit via the common coupling circuit when a control signal is present on the first control circuit, the transmitting and external circuits being substantially electrically isolated from the receiving and antenna circuits;

a third circuit path interconnecting the transmitting circuit and the external circuit via the common coupling circuit when a control signal is present on the second control circuit, the receiving and antenna circuits being substantially electrically isolated from the transmitting and external circuits; and a fourth circuit path interconnecting the receiving circuit and the external circuit via the common coupling circuit when a control signal is present on the first and second control circuits, the transmitting and antenna circuits being substantially electrically isolated from the receiving and external circuits.

11. The switching module of claim 10, wherein the first and second control circuits each comprise a first and second leg, the first leg including a nulling capacitor and a biasing diode having a cathode and an anode, the anode being connected to a nulling capacitor, the second leg including a transmission line choke of about one-quarter wavelength being connected to a shunt capacitor.

12. The switching module of claim 11, wherein the transmitting circuit comprises a DC blocking capacitor being connected to a transmission line of about one-quarter wavelength and the first leg of the first control circuit, whereby a signal in the first circuit path does not pass through any diode.

13. The switching module of claim 11, wherein the receiving circuit comprises a DC blocking capacitor, a transmission line of about one-quarter wavelength and a diode having an anode and a cathode, the DC blocking capacitor being connected to the second leg of the first control circuit and the transmission line, the transmission line being connected to the cathode of the diode.

14. The switching module of claim 11, wherein the antenna circuit comprises a DC blocking capacitor being connected to a transmission line of about one-quarter wavelength and the first leg of the second circuit, whereby a signal in the first circuit path does not pass through any diode.

15. The switching module of claim 11, wherein the external circuit comprises a DC blocking capacitor and a diode having an anode and a cathode, the DC blocking capacitor being connected to the second leg of the second control circuit and the cathode of the diode.

16. The switching module of claim 11, wherein the transmission line chokes comprise a characteristic impedance about twice that of the transmitting, receiving, antenna or coupling transmission lines, the transmitting, receiving, antenna and coupling transmission lines having about equivalent characteristic impedances.

17. The switching module of claim 16, wherein the transmission line chokes comprise a characteristic impedance of about 115 ohms, the transmitting, receiving, antenna and coupling transmission lines each comprising a characteristic impedance of about 50 to 75 ohms.

18. The switching module of claim 10, wherein the common coupling circuit comprises a transmission line of about one-quarter wavelength being connected to a DC blocking capacitor.

19. The switching module of claim 10, wherein the transmitting, receiving, antenna, and common coupling circuits each include a transmission line of predetermined length coupled to a stray capacitance, the predetermined length of each transmission line being selected to compensate and incorporate said each associated stray capacitance to provide a substantially equivalent one-quarter wavelength transmission line, whereby a harmonic filter is provided substantially independently for each switched circuit mode, the common coupling circuit providing a common harmonic filter element for all switching module configurations.

20. The switching module of claim 19, wherein the circuits and transmission lines are disposed upon at least one ceramic substrate.

21. A high frequency transmitting/receiving switching module including a transmitting, receiving, antenna, external and common coupling circuit including at least one integral harmonic filter, the transmitting and receiving circuits including a first control circuit, the antenna and external circuits including a second control circuit, the control circuits selectively permitting independent interconnection of the transmitting or receiving circuit to the antenna or external circuit via the common coupling circuit, the switching module comprising:

the transmitting circuit having an output and including a DC blocking capacitor being connected to a transmission line and a first leg of the first control circuit, the first leg including a biasing diode having a cathode and an anode, the anode being connected to a nulling capacitor, the nulling capacitor nulling the inductance of the biasing diode;

the receiving circuit having an output and including a DC blocking capacitor, a transmission line and a diode having an anode and a cathode, the DC blocking capacitor being connected to a second leg of the first control circuit and the transmission line, the transmission line being connected to the cathode of the diode, the second leg including a transmission line choke being connected to a shunt capacitor, whereby the second leg presents a substantially electrically open circuit to the receiving circuit;

the antenna circuit having an output and including a DC blocking capacitor being connected to a transmission line and a first leg of the second control circuit, the first leg including a biasing diode having a cathode and an anode, the anode being connected to a nulling capacitor, the nulling capacitor nulling the inductance of the biasing diode;

the external circuit having an output and including a DC blocking capacitor and a diode having an anode and a cathode, the DC blocking capacitor being connected to a second leg of the second control circuit and the transmission line, the transmission line being connected to the cathode of the diode capacitor, the second leg including a transmission line choke being connected to a shunt capacitor, whereby the second leg presents a substantially electrically open circuit to the external circuit;

the common coupling circuit having a first and a second junction and including a transmission line being connected to a DC blocking capacitor, the first junction connecting to the outputs of the transmitter and receiver circuits, the second junction connecting to the outputs of the antenna and external circuits;

the transmission lines of the transmitting, receiving, antenna, and common coupling circuits each having a stray capacitance and a predetermined length being selected to compensate and incorporate each associated stray capacitance to provide a substantially equivalent one-quarter wavelength transmission line;

a first circuit path interconnecting the transmitting circuit and the antenna circuit via the common coupling circuit when no control signals are present, all diodes being unbiased, the receiving, external and first leg circuit diodes presenting a high impedance to substantially electrically isolate the receiving, external and control circuits, the transmitting, coupling and antenna circuits having a low impedance and integrally providing a seven-element harmonic filter;

a second circuit path interconnecting the receiving circuit and the antenna circuit via the common coupling circuit when a control signal is present on the first control circuit, the diode of the external circuit and first leg of the second control circuit being unbiased to present a high impedance to substantially electrically isolate the external and second control circuits, the transmission line of the transmitting circuit being substantially electrically shorted at the first leg biasing diode of the first control circuit thereby presenting a substantially electrically open circuit to the receiving circuit, the receiving, coupling and antenna circuits having a low impedance and integrally providing a seven-element harmonic filter;

a third circuit path interconnecting the transmitting circuit and the external circuit via the common coupling circuit when a control signal is present on the second control circuit, the diode of the receiving circuit being unbiased to present a high impedance to substantially electrically isolated the receiving circuit, the transmission line of the antenna circuit being substantially electrically shorted at the first leg biasing diode of the second control circuit thereby presenting a substantially electrically open circuit to the external circuit, the transmitting, coupling and external circuits having a low impedance and integrally providing a five-element harmonic filter; and a fourth circuit path interconnecting the receiving circuit and the external circuit via the common coupling circuit when a control signal is present on the first and second control circuits, the transmission lines of the transmitting and antenna circuits being substantially electrically shorted at the first leg biasing diodes of the first and second control circuits thereby presenting substantially electrically open circuits to the receiving and external circuits, the receiving, coupling and external circuits having a low impedance and integrally providing a five-element harmonic filter.

* * * * *